United States Patent
Zhang et al.

(10) Patent No.: US 11,322,537 B2
(45) Date of Patent: May 3, 2022

(54) IMAGING DETECTION CHIP WITH AN OPTICAL ANTENNA COMPRISING A PLURALITY OF ANTENNA CELLS EACH COMPRISING ONE OR MORE NANOCONES COUPLED TO PHOTOSENSITIVE ARRAY

(71) Applicant: Nanjing Opy Electronic Technology Co., Ltd., Nanjing (CN)

(72) Inventors: Xinyu Zhang, Wuhan (CN); Tangansu Zhang, Wuhan (CN)

(73) Assignee: NANJING OPY ELECTRONIC TECHNOLOGY CO., LTD., Nanjing (CN)

( * ) Notice: Subject to any disclaimer, the term of this patent is extended or adjusted under 35 U.S.C. 154(b) by 105 days.

(21) Appl. No.: 16/917,867

(22) Filed: Jun. 30, 2020

(65) Prior Publication Data

US 2020/0335882 A1 Oct. 22, 2020

Related U.S. Application Data

(63) Continuation-in-part of application No. PCT/CN2019/121169, filed on Nov. 27, 2019.

(51) Int. Cl.
*H01L 27/146* (2006.01)
*H01Q 21/28* (2006.01)

(52) U.S. Cl.
CPC .. *H01L 27/14625* (2013.01); *H01L 27/14685* (2013.01); *H01Q 21/28* (2013.01)

(58) Field of Classification Search
CPC .............. H01Q 21/28; H01L 27/14625; H01L 27/14685; G01J 5/00; G01J 11/00
See application file for complete search history.

(56) References Cited

U.S. PATENT DOCUMENTS

| | | | | |
|---|---|---|---|---|
| 2007/0210956 A1* | 9/2007 | Hillis | ................ | H01Q 3/2676 342/179 |
| 2010/0193017 A1* | 8/2010 | Huth | ................ | H01L 31/108 438/73 |
| 2012/0170097 A1* | 7/2012 | Han | ................ | B82Y 20/00 977/932 |
| 2015/0323385 A1* | 11/2015 | Han | ................ | G01J 3/4412 356/300 |
| 2017/0160405 A1* | 6/2017 | Kim | ................ | G01T 1/201 |

* cited by examiner

*Primary Examiner* — Jennifer D Bennett
(74) *Attorney, Agent, or Firm* — Matthias Scholl P.C.; Matthias Scholl

(57) ABSTRACT

An imaging detection chip, including an optical antenna and a photosensitive array in parallel to the optical antenna. The optical antenna is an array structure including a plurality of antenna cells spaced apart and electrically connected to each other. The photosensitive array is an array structure including a plurality of photosensitive cells spaced apart from each other. The plurality of antenna cells and the plurality of photosensitive cells are equal in number. The plurality of antenna cells of the optical antenna is aligned, perpendicularly to a parallel direction of the photosensitive array and the optical antenna, with the plurality of photosensitive cells at corresponding positions of the photosensitive array, respectively. The plurality of antenna cells each includes one or more nanocones each including a top surface; top surfaces of the plurality of antenna cells are electrically connected to each other.

15 Claims, 7 Drawing Sheets

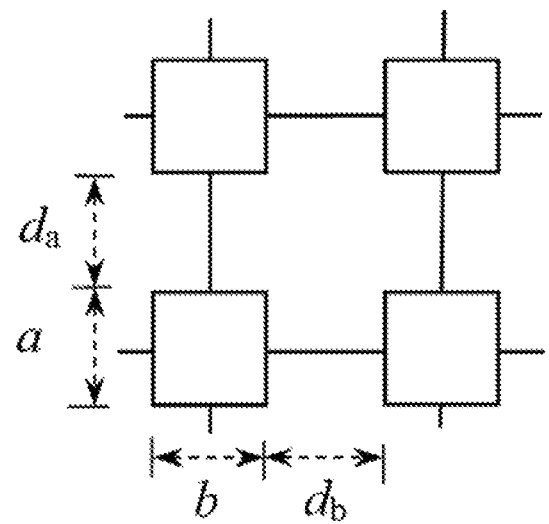
FIG. 5
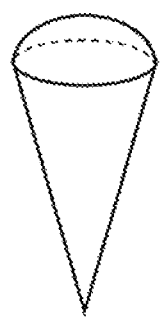 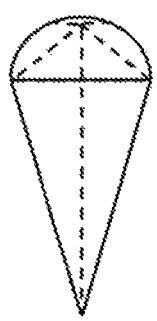  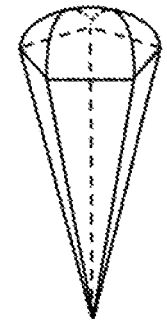 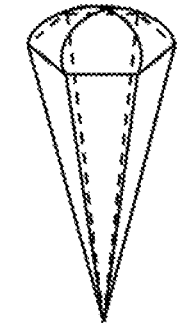
FIG. 6A     FIG. 6B     FIG. 6C     FIG. 6D     FIG. 6E

IMAGING DETECTION CHIP WITH AN OPTICAL ANTENNA COMPRISING A PLURALITY OF ANTENNA CELLS EACH COMPRISING ONE OR MORE NANOCONES COUPLED TO PHOTOSENSITIVE ARRAY

CROSS-REFERENCE TO RELATED APPLICATIONS

This application is a continuation-in-part of International Patent Application No. PCT/CN2019/121169 with an international filing date of Nov. 27, 2019, designating the United States, now pending, and further claims foreign priority benefits to Chinese Patent Application No. 201910081938.3 filed Jan. 28, 2019, and to Chinese Patent Application No. 201910082563.2 filed Jan. 28, 2019. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

The disclosure relates to an imaging detection chip comprising an optical antenna coupled to a photosensitive array and a method of preparing the same.

Common photosensitive imaging arrays include photon detectors and thermal detectors. Photon detectors include visible light detectors (commonly complementary metal-oxide-semiconductor transistor (CMOS) devices) and infrared detectors (commonly focal plane arrays (FPAs)). The visible light detectors are mainly used in the civilian field, and the minimum luminous power that can be detected is as low as nanowatts; the infrared detectors are mainly used in the military field, because of relatively high cost. The thermal detectors are based on the thermal detection mode of micro-heat absorption and photoelectric signal generation.

The following disadvantages are associated with the known photosensitive imaging arrays: 1) the photosensitive imaging arrays are insufficient in detecting weak optical signals with power in picowatts; 2) the photon detectors are unable to detect both visible light and infrared light; 3) although the thermal detectors are able to detect both visible light and infrared light simultaneously, their detection sensitivity is at least one order of magnitude lower than that of the photon detectors.

SUMMARY

One aspect of the disclosure provides an imaging detection chip, the imaging detection chip comprising an optical antenna and a photosensitive array in parallel to a plane where the optical antenna is situated. The optical antenna is an array structure comprising a plurality of antenna cells spaced apart and electrically connected to each other. The photosensitive array is an array structure comprising a plurality of photosensitive cells spaced apart from each other. The plurality of antenna cells and the plurality of photosensitive cells are equal in number. Each of antenna cells of the optical antenna is aligned, with a corresponding photosensitive cell of the photosensitive array, in a direction perpendicular to the plane of the optical antenna. The plurality of antenna cells of the optical antenna each comprises one or more nanocones each comprising a top surface; top surfaces of the plurality of antenna cells are electrically connected to each other. The nanocone is a tapered structure, the top surface of each of the one or more nanocones is a curved structure. One end of the optical antenna and one end of the photosensitive array are respectively connected to an external control signal source through metal wires.

When the imaging detection chip is used to detect a weak optical signal with power in picowatts, each antenna cell comprises one or more nanocones, the nanocones are uniformly spaced apart from each other at a fixed distance as the antenna cell comprises more than one nanocone.

The lower limit of the number of each of the one or more nanocones is such that the plurality of photosensitive cells can produce an effective signal output, i.e., a signal noise ratio or signal clutter ratio greater than or equal to 1, and the upper limit of the number of each of the one or more nanocones is such that, after the one or more nanocones in a single antenna cell are spaced apart from each other at a fixed distance, the overall size of the single antenna cell is not larger than that of a single photosensitive cell.

The cross-section of the top surface of each of the one or more nanocones, along a plane perpendicular to an axis of the nanocone, is circular, elliptical, triangular, or polygonal.

When the cross-section of the top surface of each of the one or more nanocones, along a plane perpendicular to an axis of the nanocone, is circular, the diameter thereof is between 30 nm and 600 nm.

The distance between the tip of each of the one or more nanocones and the top surface of the photosensitive array is between 10 nm and 60 nm.

The imaging detection chip is packaged inside a chip carrier. The chip carrier comprises a first side oriented to the optical antenna and provided with an optical window thereby indicating the optical antenna is disposed on the first side, and a second side adjacent to the optical window and provided with an electrical interface through which the imaging detection chip is connected to a light path structure.

When the imaging detection chip is used to detect either visible light or infrared light, the photosensitive array is a photon detector, and when the imaging detection chip is used to detect both visible light and infrared light simultaneously, the photosensitive array is a thermal detector.

According to another aspect of the disclosure, provided is a method for preparing an imaging detection chip comprising an optical antenna coupled to a photosensitive array, the method comprising:

an optical antenna production process, comprising following steps:

(1) ultrasonically cleaning a silicon substrate with acetone, alcohol, and deionized water consecutively, drying, coating a photoresist on an end face of the dried silicon substrate, and drying;

(2) processing, by photolithography, the photoresist coated on the silicon substrate by a focused electron beam, developing the silicon substrate processed by photolithography, rinsing with deionized water, and drying;

(3) heating the developed silicon substrate to a temperature of 120° C. to 150° C. under vacuum for more than 10 minutes to form an arrayed photoresist surface structure with a circular arch, an elliptical arch, a triangular arch, or a polygonal arch;

(4) heating arrayed photoresist surface structure, etching the arrayed photoresist surface structure heated, at an angle with respect to a vertical line of the arrayed photoresist surface structure, using a parallel ion beam to obtain a nanocone pattern, and cleaning the nanocone pattern;

(5) ultrasonically cleaning a first quartz or zinc selenide substrate with acetone, alcohol, and deionized water consecutively, and drying;

(6) coating a photoresist on an end face of the first quartz or zinc selenide substrate, and drying;

(7) covering and pressing the nanocone pattern on the end face of one side of the first quartz or zinc selenide substrate coated with the photoresist, thereby stamping the nanocone pattern to the first quartz or zinc selenide substrate;

(8) electroplating a metal on one side of the first quartz or zinc selenide substrate printed with the nanocone pattern, and cleaning the first quartz or zinc selenide substrate;

(9) ultrasonically cleaning a second quartz or zinc selenide substrate with acetone, alcohol, and deionized water consecutively, and drying;

(10) bonding the one side of the first quartz or zinc selenide substrate electroplated with the metal and the second quartz or zinc selenide substrate, developing substrates bonded to remove the photoresist adhered to a metal film and a support substrate thereof to obtain an optical antenna, and cleaning the optical antenna; and a process of integrating the optical antenna with the photosensitive array, comprising:

(11) leading out metal wires from one side of the optical antenna and the photosensitive array;

(12) aligning each antenna cell (composing one or more nanocones) in the optical antenna with a corresponding photosensitive cell of the photosensitive array, in a direction perpendicular to the plane of the optical antenna;

(13) sealing the optical antenna and the photosensitive array with an UV adhesive, drying, and connecting the metal wires led out from the optical antenna and the photosensitive array to pins inside a chip carrier.

During the alignment of the photosensitive cell in 12), a distance between the tip of each nanocone and the top surface of the photosensitive array is between 10 nm and 60 nm.

The following advantages are associated with the imaging detection chip comprising an optical antenna coupled to a photosensitive array according to embodiments of the disclosure:

1. Since surface waves are collected by the resonant surface electromagnetic excitation of the optical antenna in the disclosure, the amplified collection of weak optical signals with power in picowatts can be realized and the detection sensitivity is greater than $10^9$ cm $Hz^{1/2}W^{-1}$ 2. The optical antenna collects visible light and broad-spectrum infrared light when the photosensitive array in the disclosure is a thermal detector. Therefore, the detection chip of the disclosure can detect both visible light and broad-spectrum infrared light, thereby realizing wide-spectrum detection.

3. The optical antenna collects visible light or infrared light when the photosensitive array of the disclosure is a photon detection array. The detection chip of the disclosure can detect visible light or infrared light with a fast response speed.

4. In the disclosure, by the coupling correlation between the surface electromagnetic waves and the surface electron density waves of the optical antenna, the distribution density of itinerant electrons on the surface of the optical antenna is electronically controlled, and thus the nano-focusing intensity of the surface electromagnetic waves can be adjusted.

5. In disclosure, the imaging beams are collected by the optical antenna with high gain. Under the premise of basically maintaining the noise level of the photosensitive structure, based on the photosensitivity at the tip of the optical antenna, the sensitivity in detecting visible light and infrared light can be improved with high gain.

6. In disclosure, on one hand, the effective signals output by the photosensitive cells can be adjusted by adjusting the amplitude of the external control signals; on the other hand, the ON/OFF state of the optical antenna can be changed by changing the polarity of the external control signals. Therefore, the imaging detection chip of the disclosure is intelligent.

7. Since an optical antenna that can be controlled by precise electric drive is used in the disclosure, the disclosure has the characteristic of high control accuracy.

8. The main body of the imaging detection chip is the optical antenna and photosensitive array packaged in the chip carrier. By the arranged electronic interface, it is convenient to plug the imaging detection chip in the light path and it is easy to couple the imaging detection chip to the conventional optical, optoelectronic and mechanical structures.

According to another aspect of the disclosure, provided is an imaging detection chip, comprising an optical antenna, a fluorescent film layer and a photosensitive array in parallel to each other. The optical antenna is an array structure comprising a plurality of antenna cells spaced apart and electrically connected to each other. The fluorescent film layer is an array structure comprising a plurality of fluorescent film cells spaced apart and electrically connected to each other. The photosensitive array is an array structure comprising a plurality of photosensitive cells spaced apart from each other. The array sizes and shapes of the optical antenna, the fluorescent film layer and the photosensitive array are identical. Each of antenna cells of the optical antenna is aligned, with a corresponding photosensitive cell of the photosensitive array and a corresponding fluorescent film cell of the fluorescent film layer, in a direction perpendicular to the plane of the optical antenna. The plurality of antenna cells of the optical antenna each comprises one or more nanocones each comprising a top surface. The top surfaces of the plurality of antenna cells are electrically connected to each other. Each of the one or more nanocones is a tapered structure, and the top surface of each of the one or more nanocones is a curved structure. Each of the one or more nanocones comprises a tip pointing to a corresponding fluorescent film cell. One end of the optical antenna and one end of the fluorescent film layer are respectively connected to an external control signal source through metal wires.

When the imaging detection chip is used to detect a weak optical signal with power in picowatts, each antenna cell comprises one or more nanocones spaced apart from each other at a fixed distance.

The lower limit of the number of each of the one or more nanocones is such that the plurality of photosensitive cells to produce an effective signal output, and the upper limit of the number of each of the one or more nanocones is such that, after the one or more nanocones in a single antenna cell are spaced apart from each other at a fixed distance, the overall size of the single antenna cell is not larger than that of a single photosensitive cell.

The cross-section of the top surface of each of the one or more nanocones, along a plane perpendicular to an axis of the nanocone, is circular, elliptical, triangular, or polygonal.

When the cross-section of the top surface of each of the one or more nanocones, along a plane perpendicular to an axis of the nanocone, is circular, a diameter thereof is between 30 nm and 600 nm.

The distance between the tip of each of the one or more nanocones and the top surface of the fluorescent film layer is between 150 nm and 700 nm, the distance between the bottom surface of the fluorescent film layer and the top surface of the photosensitive array is between 100 nm and 800 nm, and the distance between two adjacent fluorescent film cells is between 50 nm and 500 nm.

The imaging detection chip is packaged inside a chip carrier, the chip carrier comprises a first side oriented to the optical antenna and provided with an optical window thereby the optical antenna is disposed on the first side, and a second side adjacent to the optical window and provided with an electronic interface through which the imaging detection chip is connected to a light path structure.

According to another aspect of the disclosure, provided is a method for preparing an imaging detection chip, comprising:

I. an optical antenna production process, comprising following steps:

(1) ultrasonically cleaning a silicon substrate with acetone, alcohol, and deionized water consecutively, and drying;

(2) scanning and etching, by a focused electron beam, the silicon substrate along a circular route or along a route with a rectangular edge and a circular interior, to form nanocone pattern, repeating operations of scanning and etching on different positions on a surface of the silicon substrate, thereby obtaining a silicon-based optical antenna;

(3) ultrasonically cleaning a first quartz or zinc selenide substrate with acetone, alcohol, and deionized water consecutively, and drying; coating a photoresist on an end face of the first quartz or zinc selenide substrate dried, and drying;

(4) pressing one side of the silicon-based optical antenna comprising the nanocone pattern on the one side of the first quartz or zinc selenide substrate coated with the photoresist, electroplating a metal (for example, Cu or Al) on the one side of the first quartz or zinc selenide substrate, and cleaning the first quartz or zinc selenide substrate;

(5) ultrasonically cleaning a second quartz or zinc selenide substrate with acetone, alcohol, and deionized water consecutively, and drying;

(6) bonding the one side of the first quartz or zinc selenide substrate electroplated with the metal and the second quartz or zinc selenide substrate, developing substrates bonded to remove the photoresist adhered to a metal film and a support substrate thereof to obtain an optical antenna, and cleaning the optical antenna; and II. a fluorescent film layer production process, comprising following steps:

(1) ultrasonically cleaning a third quartz or zinc selenide substrate with acetone, alcohol, and deionized water consecutively, and drying;

(2) coating a photoresist on an end face of the third quartz or zinc selenide substrate cleaned, and drying;

(3) covering a photolithography mask on one side of the third quartz or zinc selenide substrate coated with the photoresist, to process the photoresist by photolithography;

(4) developing the one side of the third quartz or zinc selenide substrate, rinsing with deionized water, and drying;

(5) etching the photoresist film on the third quartz or zinc selenide substrate with a parallel ion beam to obtain cellular grids having a depth of more than 100 µm and cleaning;

(6) filling, in the cellular grids on the third quartz or zinc selenide substrate and by wet coating, a fluorescent film layer that is 5 µm to 100 µm in depth, drying and cleaning; and III. a process of integrating the optical antenna, the fluorescent film layer and the photosensitive array, comprising following steps:

(1) leading out metal wires from one side of the optical antenna and the fluorescent film layer;

(2) aligning each antenna cell (comprising one or more nanocones) in the optical antenna, with a corresponding photosensitive cell of the photosensitive array and a corresponding fluorescent film cell of the fluorescent film layer, in a direction perpendicular to the plane of the optical antenna;

(3) sealing the optical antenna, the fluorescent film layer and the photosensitive array with an UV adhesive, drying, and connecting the metal wires led out from the optical antenna and the fluorescent film layer to pins inside the chip carrier.

During the alignment, the distance between the tip of each of the one or more nanocones and the top surface of the fluorescent film layer is between 150 nm and 700 nm, and the distance between the fluorescent film layer and the photosensitive array is between 100 nm and 800 nm.

The following advantages are associated with the imaging detection chip according to embodiments of the disclosure:

1. Since the optical antenna is used in the disclosure to collect visible light and broad-spectrum infrared light, the imaging detection chip of the disclosure can detect both visible light and broad-spectrum infrared light, thereby realizing wide-spectrum detection.

2. Since surface waves are collected by the resonant surface electromagnetic excitation of the optical antenna in the disclosure, the amplified collection of weak optical signals with power in picowatts can be realized and the detection sensitivity is greater than $10^9$ cm $Hz^{1/2}W^{-1}$.

3. In the disclosure, by excitation of fluorescence by electrons, fast response and spectral transformation are realized.

4. In the disclosure, by the coupling correlation between the surface electromagnetic waves and the surface electron density waves of the optical antenna, the distribution density of "itinerant" electrons on the surface of the optical antenna is electronically controlled, and thus the nano-focusing intensity of the surface electromagnetic waves can be adjusted.

5. In disclosure, the imaging beams are collected by the optical antenna with high gain. Under the premise of basically maintaining the noise level of the photosensitive structure, based on the excitation of strong fluorescence and photosensitivity of electrons emergent at the tip of the optical antenna, the sensitivity in detecting visible light and infrared light can be improved with high gain.

6. In disclosure, on one hand, the effective signals output by the photosensitive cells can be adjusted by adjusting the amplitude of the external control signals; on the other hand, the ON/OFF state of the optical antenna can be changed by changing the polarity of the external control signals. Therefore, the imaging detection chip of the disclosure is intelligent.

7. Since an optical antenna that can be controlled by precise electric drive is used in the disclosure, which is extremely high in the stability of structural, electrical and electro-optical parameters, the disclosure has the characteristic of high control accuracy.

8. The main body of the imaging detection chip is the optical antenna, fluorescent film layer and photosensitive array packaged in the chip carrier. By the arranged electronic interface, it is convenient to plug the imaging detection chip in the light path and it is easy to couple the imaging detection chip to the conventional optical, optoelectronic and mechanical structures.

BRIEF DESCRIPTION OF THE DRAWINGS

FIG. 5 is a schematic view of an antenna cell comprising four nanocones in the optical antenna according to one embodiment of the disclosure;

FIGS. 6A-6E are schematic views of different structures of the nanocones in the optical antenna according to one embodiment of the disclosure;

Figure 1:
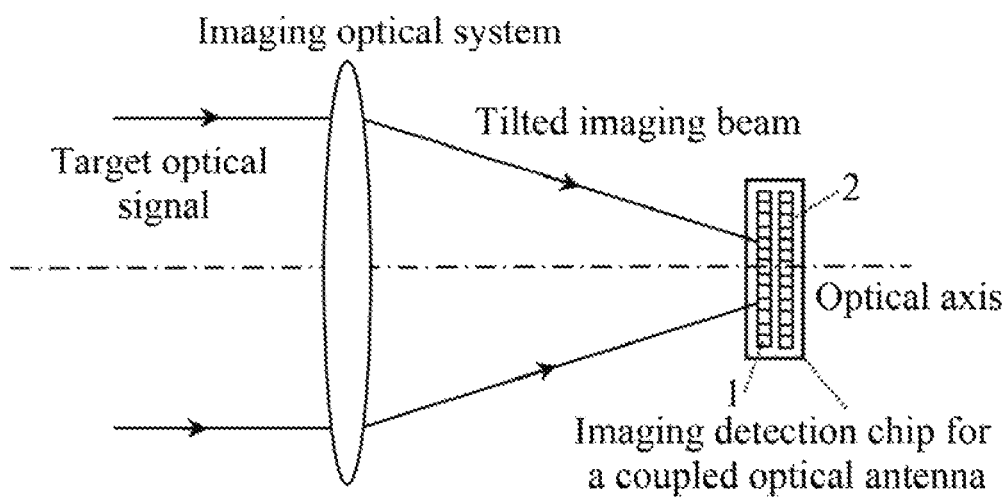
FIG. 1 is a schematic view of the configuration of an imaging detection chip comprising an optical antenna coupled to a photosensitive array in a light path, according to one embodiment of the disclosure.

In the drawings, the following reference numbers are used: 1: Optical antenna; 2: Fluorescent film layer; 3: Photosensitive array; 4: Optical window; 5: Electronic interface.

DETAILED DESCRIPTION OF THE DISCLOSURE

To further illustrate the invention, embodiments detailing an imaging detection chip comprising an optical antenna coupled to a photosensitive array and a preparation method thereof are described below. It should be noted that the following embodiments are intended to describe and not to limit the disclosure.

On the surface of various functional materials (for example, conventional metals or semiconducting silicon germanium, etc.), resonant surface waves can be generated through the excitation by visible light or infrared light. The effective transport distance of surface waves or surface plasmons comprising surface electromagnetic waves and surface electron density waves on the surface of the functional materials can be up to tens of microns. Meanwhile, the resonant accumulation of the light field on the surface of a special structure can achieve a light intensity jump of more than five orders of magnitude. In cooperation with the above-mentioned significant change in surface light intensity, the surface electron distribution density exhibits a wide range of changes. In this case, by applying an external bias electric field or magnetic field, fine modulation of the surface electron distribution density can be achieved. The disclosure aims to greatly improve the photoelectric sensitivity of a low-cost visible light detector, expand the light intensity response range to strong optical signals or weak optical signals, reduce the size of the photosensitive cells, increase the array size, and improve the spatial resolution.

The disclosure provides an imaging detection chip comprising an optical antenna coupled to a photosensitive array. By the resonantly focused imaging light waves of the optical antenna, the surface "itinerant" electrons are compressed with high density at the tip of the nanocone, thereby significantly improving the photoelectric sensitivity.

FIG. 1 is a schematic view of the configuration of an imaging detection chip comprising an optical antenna coupled to a photosensitive array in a light path, according to one embodiment of the disclosure. As shown, the target weak optical signals become imaging beams after passing through the imaging optical system (usually, the lens), which are then incident into the imaging detection chip.

According to an aspect of the disclosure, provided is an imaging detection chip, comprising an optical antenna 1 and a photosensitive array 3 in parallel to each other. The optical antenna 1 is an array structure comprising a plurality of antenna cells spaced apart and electrically connected to each other. The photosensitive array 3 is an array structure comprising a plurality of photosensitive cells spaced apart and electrically connected to each other. The array sizes and shapes of the optical antenna 1 and the photosensitive array 3 are identical (i.e., the number of cells comprised in the array). Each of antenna cells of the optical antenna 1 is aligned, with a corresponding photosensitive cell of the photosensitive array 3 and a corresponding fluorescent film cell of the fluorescent film layer, in a direction perpendicular to the plane of the optical antenna 2. One end of the optical antenna 1 and one end of the photosensitive array 3 are respectively connected to external control signals Vs through metal wires.

When the imaging detection chip is used to detect either visible light or infrared light, the photosensitive array 3 is a photon detector, and when the imaging detection chip is used to detect both visible light and infrared light, the photosensitive array 3 is a thermal detector.

By the arrangement of the optical antenna, the disclosure has the characteristic of high control accuracy.

The distance between two adjacent photosensitive cells is between 50 nm and 500 nm.

The plurality of antenna cells of the optical antenna 1 each comprises one or more nanocones each comprising a top surface. The top surfaces of the plurality of antenna cells are electrically connected to each other via wires. Each of the one or more nanocones is a tapered structure, the top surface of each of the one or more nanocones is a curved structure. The cross-section of the tapered structure may be circular (as shown in FIG. 6A), elliptical, triangular (as shown in FIG. 6B), or polygonal (as shown in FIGS. 6A-6E).

Figure 4:
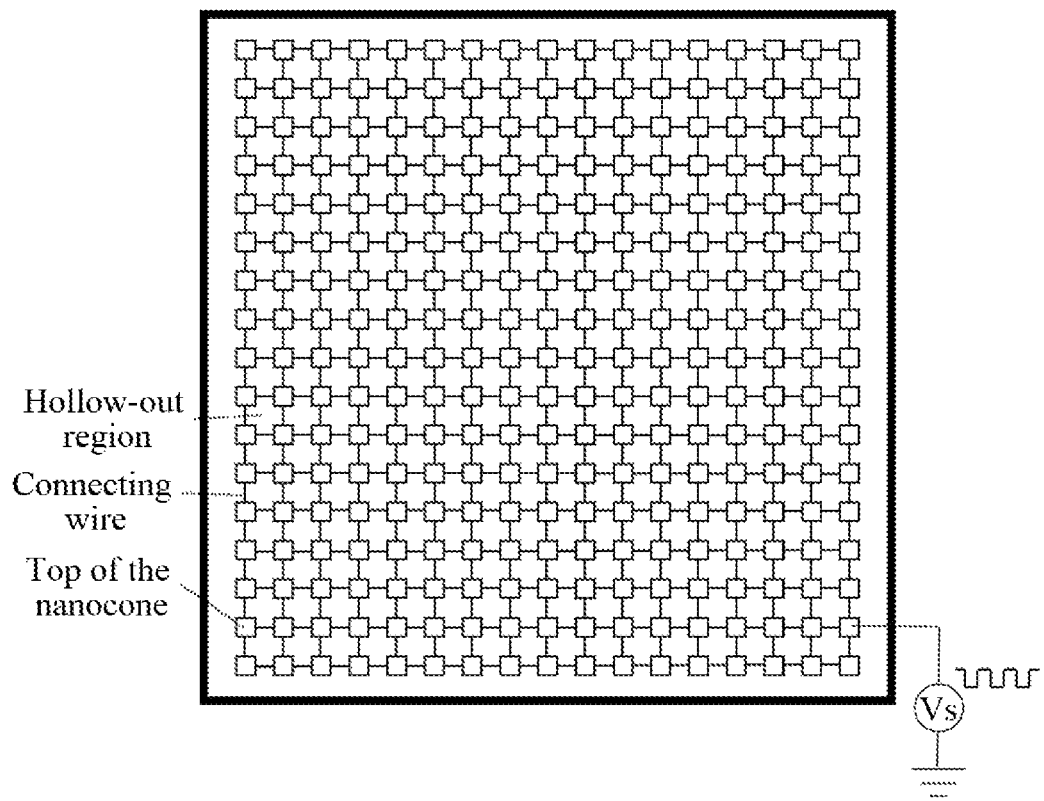
FIG. 4 is a schematic view of an optical antenna in the imaging detection chip according to one embodiment of the disclosure.

FIG. 4 shows the one or more nanocones comprised in the optical antenna according to one embodiment of the disclosure. Each of the one or more nanocones comprises a tip pointing to a corresponding fluorescent film cell. The tops of the nanocones are electrically connected to each other by electric connecting wires. As shown, the top of each of the one or more nanocones is rectangular. However, it should be understood that this shape is only for illustrative purposes and does not limit the shape of the tops of the nanocones.

The distance between the tip of each of the one or more nanocones and the top surface of the photosensitive array (i.e., the near-field spacing) is between 10 nm and 60 nm.

The use of such a tapered structure is to guide the surface waves excited by the incident beams after their arrival at the antenna cells to the tip of the tapered structure and resonantly superimpose the surface waves at the tip to realize nano-focusing.

When the imaging detection chip is used to detect weak optical signals (i.e., optical signals with power in picowatts), each antenna cell comprises one or more nanocones evenly disposed (for example, in an equilateral triangle, a rectangle, a regular polygon, etc.). In this case, the specific number of nanocones is determined by the following two restrictions:

(1) the lower limit of the number of each of the one or more nanocones is such that the plurality of photosensitive cells can produce an effective signal output; and (2) the upper limit of the number of each of the one or more nanocones is such that, after the more than one nanocone in a single antenna cell are spaced apart from each other at a fixed distance, the overall size of the single antenna cell is not larger than that of a single photosensitive cell.

In FIG. 5, an antenna cell comprising four nanocones distributed evenly (i.e., in a rectangle), is shown. The top of each of the four nanocones is rectangular. The sum of the distance Db between two adjacent nanocones in the horizontal direction and the length b of the two adjacent nanocones (i.e., Db+2b), and the sum of the distance Da between two adjacent nanocones in the vertical direction and the height a of the two adjacent nanocones (i.e., Da+2a) do not exceed the size of the corresponding photosensitive cell.

Figure 3:
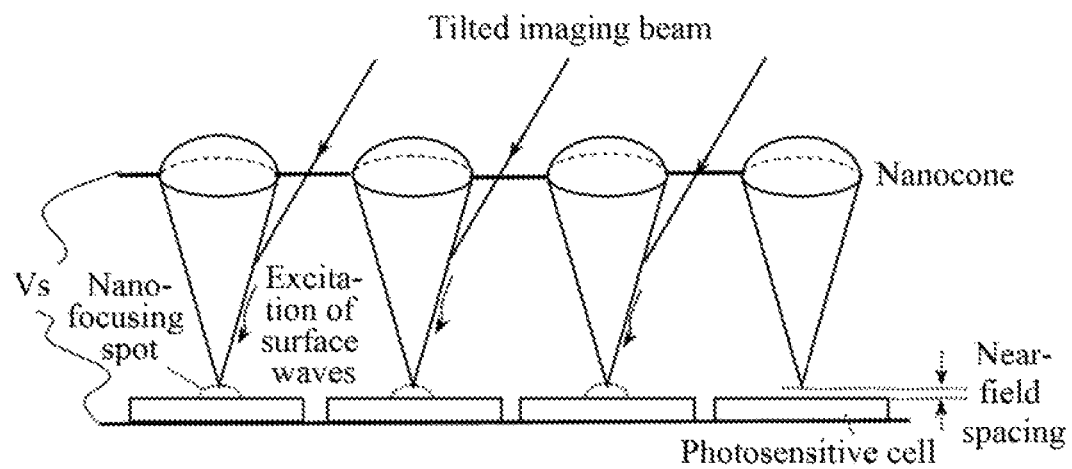
FIG. 3 is a schematic view of an imaging detection chip comprising an optical antenna coupled to a photosensitive array in a light path, according to another embodiment of the disclosure.

As shown in FIG. 3, one antenna cell comprises two nanocones. It should be understood that this number is only for illustrative purposes and does not limit the number of nanocones in the disclosure.

Figure 2:
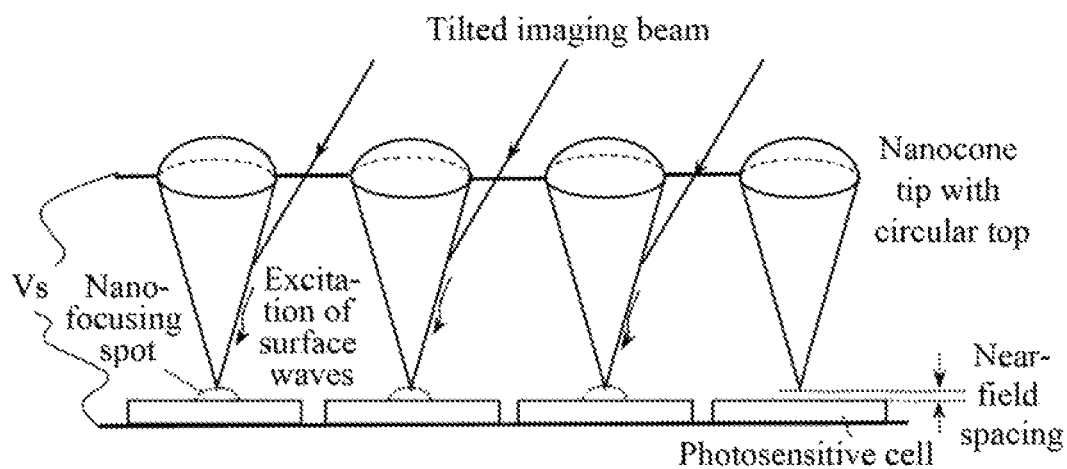
FIG. 2 is a schematic view of an imaging detection chip comprising an optical antenna coupled to a photosensitive array in a light path, according to one embodiment of the disclosure.

As shown in FIG. 2, one antenna cell comprises only one nanocone. In this case, the imaging detection chip according to one embodiment of the disclosure can be used to detect other optical signals except for weak optical signals (i.e., optical signals with power in picowatts).

The working principle of the disclosure will be explained below with reference to FIGS. 2 and 3.

The target weak optical signals (which may be visible light or infrared light) become imaging beams after passing through the imaging optical system of FIG. 1. The imaging beams, when being obliquely incident to the surfaces of the antenna cells of the optical antenna, excite surface waves. The surface waves are guided to the tips of the nanocones by the antenna cells, where the surface waves are resonantly superposed to realize nano-focusing. By adjusting the external control signals (when the photosensitive array in FIGS. 2 and 3 is connected to a positive voltage and grounded on the top), the electron density waves on the surface of the optical antenna and the nano-focusing light waves can be adjusted. When the external control signals are connected reversely (that is, when the polarity is reversed), since the surface waves cannot be excited in this case, the optical antenna stops working.

Since the optical antenna is used in the disclosure to collect visible light and broad-spectrum infrared light, the detection chip of the disclosure can detect both visible light and broad-spectrum infrared light, thereby realizing wide-spectrum detection.

Further, since surface waves are collected by the resonant surface electromagnetic excitation of the optical antenna in the disclosure, the amplified collection of weak optical signals with power in picowatts can be realized and the detection sensitivity is greater than $10^9$ cm $Hz^{1/2}W^{-1}$.

Further, in the disclosure, by the coupling correlation between the surface electromagnetic waves and the surface electron density waves of the optical antenna, the distribution density of "itinerant" electrons on the surface of the optical antenna is electronically controlled, and thus the nano-focusing intensity of the surface electromagnetic waves can be adjusted.

Further, in disclosure, the imaging beams are collected by the optical antenna with high gain. Under the premise of basically maintaining the noise level of the photosensitive structure, based on the photosensitivity at the tip of the optical antenna, the sensitivity in detecting visible light and infrared light can be improved with high gain.

Further, in disclosure, on one hand, the effective signals output by the photosensitive cells can be adjusted by adjusting the amplitude of the external control signals; on the other hand, the ON/OFF state of the optical antenna can be changed by changing the polarity of the external control signals. Therefore, the imaging detection chip of the disclosure is intelligent.

Figure 7:
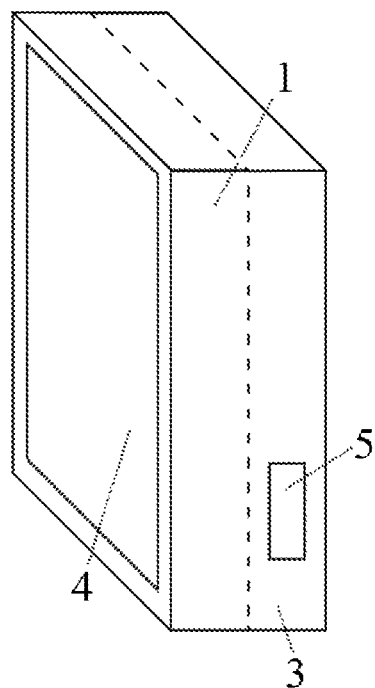
FIG. 7 is a schematic view of a packaging structure for the imaging detection chip according to one embodiment of the disclosure.

FIG. 7 is a schematic view of a packaging structure for the imaging detection chip according to one embodiment of the disclosure. As shown, the whole imaging detection chip is packaged inside the chip carrier. The chip carrier comprises a first side oriented to the optical antenna 1 and provided with an optical window 4 thereby the optical antenna 1 is disposed on the first side, and a second side adjacent to the optical window 4 and provided with an electronic interface 5 through which the imaging detection chip is connected to a light path structure.

By the arrangement of the electronic interface, it is convenient to plug the imaging detection chip in the light path and it is easy to couple the imaging detection chip to the conventional optical, optoelectronic and mechanical structures.

According to another aspect of the disclosure, provided is a method for preparing an imaging detection chip, the method comprising an optical antenna production process and a process of integrating the optical antenna with the photosensitive array, where:

the optical antenna production process comprises following steps:

(1) ultrasonically cleaning a silicon substrate with acetone, alcohol, and deionized water consecutively, drying the silicon substrate cleaned, coating a photoresist on an end face of the dried silicon substrate by a spin coater, and drying the silicon substrate coated with the photoresist for 5 minutes to 20 minutes;

(2) processing, by photolithography, the photoresist coated on the silicon substrate by a focused electron beam, developing the silicon substrate processed by photolithography, rinsing with deionized water, and drying for 2 minutes to 5 minutes;

(3) heating the developed silicon substrate to a temperature of 120° C. to 150° C. under vacuum for more than 10 minutes to form an array of photoresist structures with a circular arch, an elliptical arch, a triangular arch, or a polygonal arch;

(4) etching the arrayed photoresist surface structure, which is already treated by heating, with a parallel ion beam to obtain nanocone pattern, and cleaning the arrayed photoresist surface structure;

(5) ultrasonically cleaning a first quartz or zinc selenide substrate with acetone, alcohol, and deionized water consecutively, and drying;

(6) coating photoresist on an end face of the first quartz or zinc selenide substrate, and drying for 5 minutes to 20 minutes;

(7) covering and pressing the prepared nanocone pattern on the end surface of the quartz or zinc selenide substrate coated with photoresist, thereby stamping the nanocone pattern to the first quartz or zinc selenide substrate;

(8) electroplating a metal (for example, Cu or Al) on one side of the first quartz or zinc selenide substrate printed with the nanocone pattern, and cleaning the first quartz or zinc selenide substrate;

(9) ultrasonically cleaning a second quartz or zinc selenide substrate with acetone, alcohol, and deionized water consecutively, and drying; and

(10) bonding the one side of the first quartz or zinc selenide substrate electroplated with the metal and the second quartz or zinc selenide substrate, developing substrates bonded to remove the photoresist adhered to a metal film and a support substrate thereof to obtain an optical antenna, and cleaning the optical antenna; and the process of integrating the optical antenna with the photosensitive array comprises following steps:

(1) leading out metal wires from one side of the optical antenna and the photosensitive array;

(2) aligning each antenna cell (comprising one or more nanocones) in the optical antenna, with a corresponding photosensitive cell of the photosensitive array, in a direction perpendicular to the plane of the optical antenna; and keeping the distance between the tip of each nanocone and the top surface of the photosensitive array (i.e., the near-field spacing) between 10 nm and 60 nm; (3) sealing the optical antenna and the photosensitive array with an UV adhesive, drying, and connecting the metal wires led out from the optical antenna and the photosensitive array to pins inside a chip carrier.

On the surface of various functional materials (for example, conventional metals or semiconducting silicon germanium, etc.), resonant surface waves can be generated through the excitation by visible light or infrared light. The effective transport distance of surface waves or surface plasmons comprising surface electromagnetic waves and surface electron density waves on the surface of the functional materials can be up to tens of microns. Meanwhile, the resonant accumulation of the light field on the surface of a special structure can achieve a light intensity jump of more than five orders of magnitude. In response to the above-mentioned significant change in surface light intensity, the surface electron distribution density exhibits a wide range of changes. In this case, by coating an external bias electric field or magnetic field, both the fine modulation of the surface electron distribution density and the surface electron emission can be achieved. When these electrons hit the fluorescent material and excite strong fluorescence in the visible spectrum, the incident light can be amplified and the spectral transformation from infrared light to visible light can be achieved. Meanwhile, the disclosure can greatly improve the photoelectric sensitivity of a low-cost visible light detector, transform infrared light to the visible light spectrum to perform photoelectric detection, expand the light intensity response range to strong optical signals or weak optical signals, reduce the size of the photosensitive cells, increase the array size, and improve the spatial resolution.

The disclosure further provides an imaging detection chip based on excitation of fluorescence by electrons at tip of each nanocone. By the resonantly focused imaging light waves of the optical antenna, the surface "itinerant" electrons are compressed with high density at the tip of each nanocone. By emitting electrons to the fluorescent film layer from the tip, the fluorescence is excited for photoelectric conversion.

Figure 8:
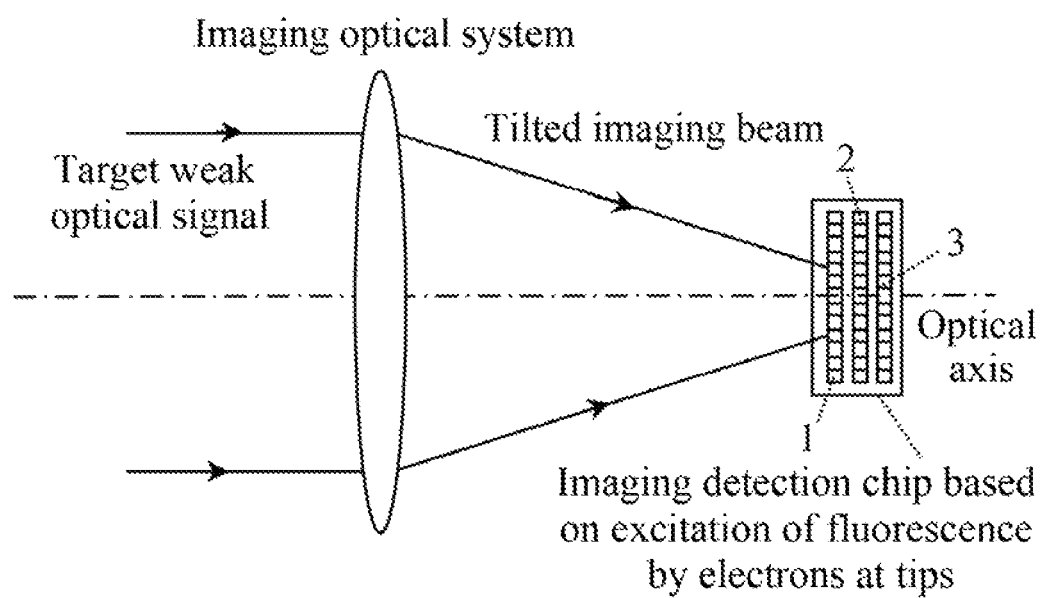
FIG. 8 is a schematic view of the configuration of a photosensitive imaging detection chip based on excitation of fluorescence by electrons at tips in a light path, according to one embodiment of the disclosure.

FIG. 8 is a schematic view of the configuration of an imaging detection chip based on excitation of fluorescence by electrons at the tip of each nanocone in a light path, according to one embodiment of the disclosure. As shown, the target weak optical signals become imaging beams after passing through the imaging optical system (usually, the lens), which are then incident into the imaging detection chip.

According to an aspect of the disclosure, provided is an imaging detection chip based on excitation of fluorescence by electrons at tips, comprising an optical antenna 1, a fluorescent film layer 2 and a photosensitive array 3 in parallel to each other. The optical antenna 1 is an array structure comprising a plurality of antenna cells spaced apart and electrically connected to each other. The fluorescent film layer 2 is an array structure comprising a plurality of fluorescent film cells spaced apart and electrically connected to each other. The photosensitive array 3 is an array structure comprising a plurality of photosensitive cells spaced apart from each other. The array sizes and shapes of the plurality of optical antenna 1, the plurality of fluorescent film layer 2 and the plurality of photosensitive array 3 are identical (i.e., the number of cells comprised in the array), and the plurality of fluorescent film layer 2 and the plurality of photosensitive array 3 are completely the same in size. Each of antenna cells of the optical antenna 1 is aligned, with a corresponding photosensitive cell of the photosensitive array 3 and a corresponding fluorescent film cell of the fluorescent film layer 2, in a direction perpendicular to the plane of the optical antenna. One end of the optical antenna 1 and one end of the fluorescent film layer 2 are respectively connected to external control signals Vs through metal wires.

By the arrangement of the optical antenna which is extremely high in the stability of structural, electrical and electro-optical parameters, the disclosure has the characteristic of high control accuracy.

The distance between two adjacent fluorescent film cells is between 50 nm and 500 nm.

Figures 13A, 13B, 13C, 13D, 13E:
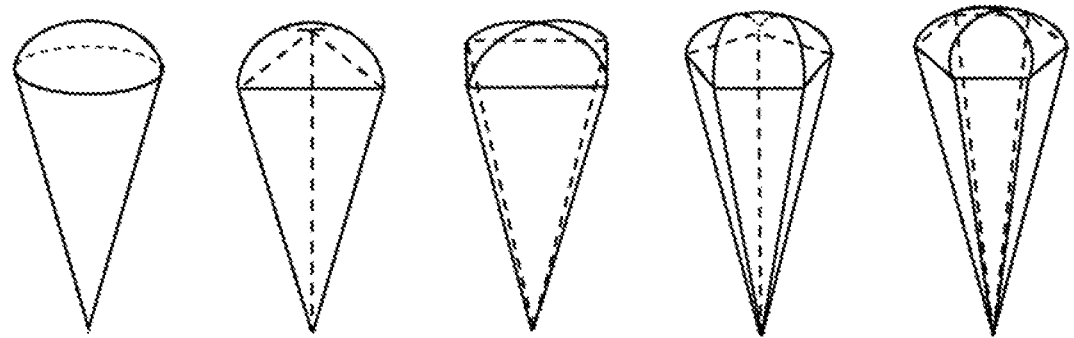
FIGS. 13A-13E are schematic views of different structures for the nanocones in the optical antenna according to one embodiment of the disclosure.

The plurality of antenna cells of the optical antenna 1 each comprises one or more nanocones each comprising a top surface. The top surfaces of the plurality of antenna cells are electrically connected to each other. Each of the one or more nanocones is a tapered structure, the top surface of each of the one or more nanocones is a curved structure. Each of the one or more nanocones comprises a tip pointing to a corresponding fluorescent film cell. The cross-section of the curved structure may be circular (as shown in FIG. 13A), elliptical, triangular (as shown in FIG. 13B), or polygonal (as shown in FIGS. 13A-13E).

Figure 11:
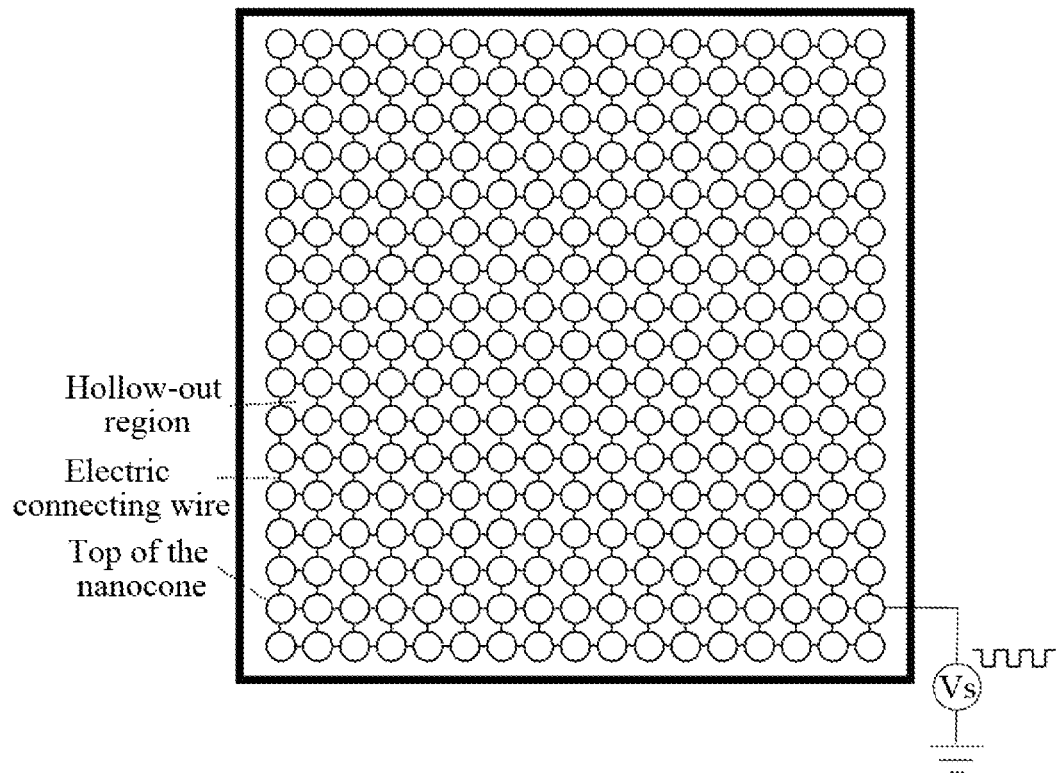
FIG. 11 is a schematic view of an optical antenna in the photosensitive imaging detection chip based on excitation of fluorescence by electrons at tips, according to one embodiment of the disclosure.

FIG. 11 shows the one or more nanocones comprised in the optical antenna according to one embodiment of the disclosure. The tops of the nanocones are electrically connected to each other by electric connecting wires. As shown, the top of the at least one nanocone is circular. However, it should be understood that this shape is only for illustrative purposes and does not limit the shape of the tops of the nanocones.

The distance between the tip of each of the one or more nanocones and the top surface of the fluorescent film layer is between 150 nm and 700 nm, and the distance between the bottom surface of the fluorescent film layer and the top surface of the photosensitive array is between 100 nm and 800 nm.

The use of such a tapered structure is to guide the surface waves excited by the incident beams after their arrival at the antenna cells to the tip of the tapered structure and resonantly superimpose the surface waves at the tip to realize nano-focusing.

When the imaging detection chip based on excitation of fluorescence by electrons at tips is used to detect weak optical signals (i.e., optical signals with power in picowatts), each antenna cell comprises one or more nanocones evenly disposed (for example, in an equilateral triangle, a rectangle, a regular polygon, etc.). In this case, the specific number of nanocones is determined by the following two restrictions:

(1) the lower limit of the number of each of the one or more nanocones is such that the plurality of photosensitive cells can produce an effective signal output;

(2) the upper limit of the number of each of the one or more nanocones is such that, after the more than one nanocone in a single antenna cell are spaced apart from each other at a fixed distance, the overall size of the single antenna cell is not larger than that of a single photosensitive cell.

Figure 12:
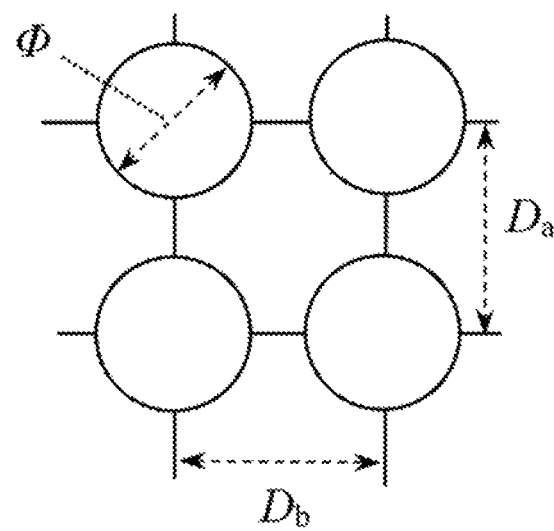
FIG. 12 is a schematic view of an antenna cell comprising four nanocones in the optical antenna according to one embodiment of the disclosure.

In FIG. 12, an antenna cell comprising four nanocones distributed evenly (i.e., in a rectangle), is shown. The top of each of the four nanocones is circular. The distance Db between the centers of the tops of two adjacent nanocones in the horizontal direction and the distance Da between the centers of the tops of two adjacent nanocones in the vertical direction do not exceed the size of the corresponding photosensitive cell.

Figure 10:
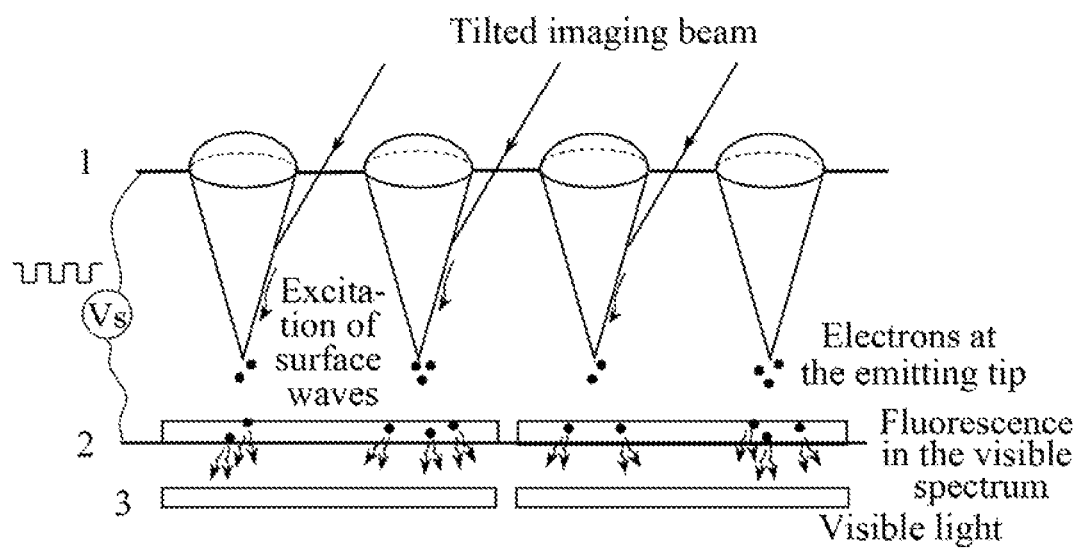
FIG. 10 is a schematic view of a photosensitive imaging detection chip based on excitation of fluorescence by electrons at tips, according to another embodiment of the disclosure.

As shown in FIG. 10, one antenna cell comprises two nanocones. It should be understood that this number is only for illustrative purposes and does not limit the number of nanocones in the disclosure.

Figure 9:
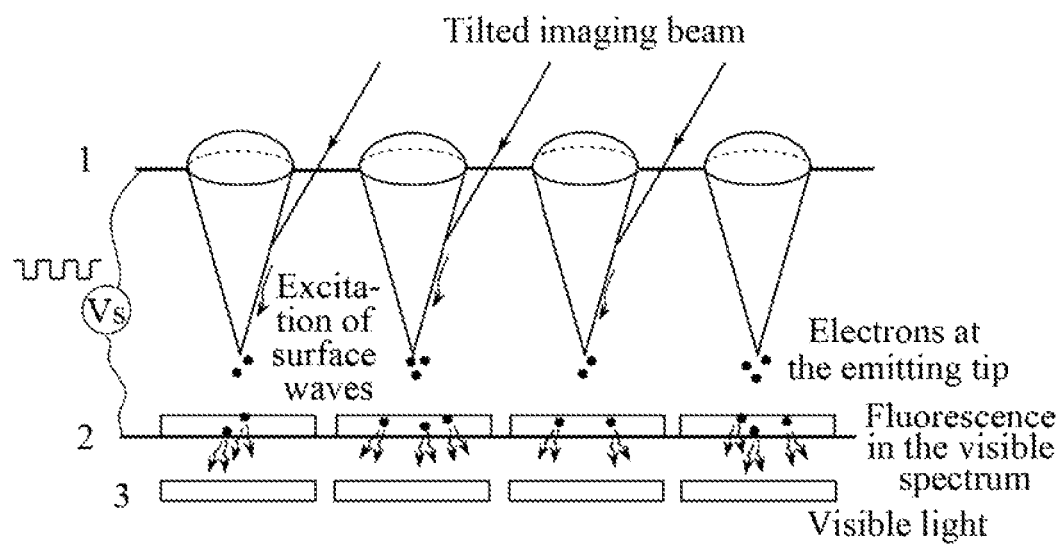
FIG. 9 is a schematic view of a photosensitive imaging detection chip based on excitation of fluorescence by electrons at tips, according to one embodiment of the disclosure.

As shown in FIG. 9, one antenna cell comprises only one nanocone. In this case, the imaging detection chip based on excitation of fluorescence by electrons at tips according to one embodiment of the disclosure can be used to detect other optical signals except for weak optical signals (i.e., optical signals with power in picowatts).

The working principle of the disclosure will be explained below with reference to FIGS. 9 and 10.

The target weak optical signals (which may be visible light or infrared light) become imaging beams after passing through the imaging optical system of FIG. 8. The imaging beams, when being obliquely incident to the surfaces of the antenna cells of the optical antenna, excite surface waves. The surface waves are guided to the tips of the nanocones by the antenna cells, where the surface waves are resonantly superposed to realize nano-focusing. By adjusting the external control signals (when the fluorescent film layer in FIGS. 9 and 10 is connected to a positive voltage and grounded on the top), the electrons overflow from the tips of the nanocones toward the fluorescent film cells. Visible light is emitted when the electrons hit the fluorescent film cells. The visible light radiating from the fluorescent film cells irradiates to the photosensitive cells in the photosensitive array and the photosensitive cells output effective photoelectric signals. When the external control signals are connected reversely (that is, when the polarity is reversed), since the surface waves cannot be excited in this case, the optical antenna stops working. During this process, the fluorescent film cells function to, on one hand, emit visible light (comprising near-infrared light), and on the other hand, perform spectral transformation from infrared light to visible light.

Since the optical antenna is used in the disclosure to collect visible light and broad-spectrum infrared light, the detection chip of the disclosure can detect both visible light and broad-spectrum infrared light, thereby realizing wide-spectrum detection.

Further, since surface waves are collected by the resonant surface electromagnetic excitation of the optical antenna in the disclosure, the amplified collection of weak optical signals with power in picowatts can be realized and the detection sensitivity is greater than $10^9$ cm $Hz^{1/2}W^{-1}$.

Further, in the disclosure, by fluorescence excitation by electrons, fast response and spectral transformation are realized.

Further, in the disclosure, by the coupling correlation between the surface electromagnetic waves and the surface electron density waves of the optical antenna, the distribution density of "itinerant" electrons on the surface of the optical antenna is electronically controlled, and thus the nano-focusing intensity of the surface electromagnetic waves can be adjusted.

Further, in disclosure, the imaging beams are collected by the optical antenna with high gain. Under the premise of basically maintaining the noise level of the photosensitive structure, based on the excitation of strong fluorescence and photosensitivity of electrons emergent at the tip of the optical antenna, the sensitivity in detecting visible light and infrared light can be improved with high gain.

Further, in disclosure, on one hand, the effective signals output by the photosensitive cells can be adjusted by adjusting the amplitude of the external control signals; on the other hand, the ON/OFF state of the optical antenna can be changed by changing the polarity of the external control signals. Therefore, the imaging detection chip of the disclosure is intelligent.

Figure 14:
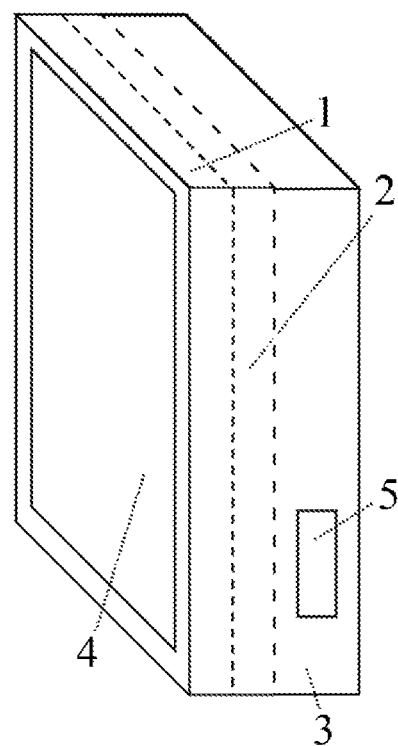
FIG. 14 is a schematic view of a packaging structure for the photosensitive imaging detection chip based on excitation of fluorescence by electrons at tips, according to one embodiment of the disclosure.

FIG. 14 is a schematic view of a packaging structure for the imaging detection chip based on excitation of fluorescence by electrons at tips according to one embodiment of the disclosure. As shown, the whole imaging detection chip is packaged inside the chip carrier. The chip carrier comprises a first side oriented to the optical antenna 1 and provided with an optical window 4 thereby the optical antenna 1 is disposed on the first side, and a second side adjacent to the optical window 4 and provided with an electronic interface 5 through which the imaging detection chip is connected to a light path structure.

By the arrangement of the electronic interface, it is convenient to plug the imaging detection chip in the light path and it is easy to couple the imaging detection chip to the conventional optical, optoelectronic and mechanical structures.

According to another aspect of the disclosure, provided is a method for preparing an imaging probe chip based on excitation of fluorescence by electrons at tips, comprising an optical antenna production process, a fluorescent film layer production process and a process of integrating the optical antenna, the fluorescent film layer and the photosensitive array, where:

the optical antenna production process comprises following steps:

(1) ultrasonically cleaning a silicon substrate with acetone, alcohol, and deionized water consecutively, and drying the silicon substrate cleaned;

(2) scanning and etching, by a focused electron beam, the silicon substrate along a circular route or along a route with a rectangular edge and a circular interior, to form nanocone pattern, repeating operations of scanning and etching on different positions on a surface of the silicon substrate, thereby obtaining a silicon-based optical antenna;

(3) ultrasonically cleaning a first quartz or zinc selenide substrate with acetone, alcohol, and deionized water consecutively, and drying; coating a photoresist on an end face of the first quartz or zinc selenide substrate dried, and drying for 5 minutes to 20 minutes;

(4) pressing one side of the silicon-based optical antenna comprising the nanocone pattern on the one side of the first quartz or zinc selenide substrate coated with photoresist, electroplating a metal (for example, Cu or Al) on the one side of the first quartz or zinc selenide substrate, and cleaning the first quartz or zinc selenide substrate;

(5) ultrasonically cleaning a second quartz or zinc selenide substrate with acetone, alcohol, and deionized water consecutively, and drying; and (6) bonding the one side of the first quartz or zinc selenide substrate electroplated with the metal and the second quartz or zinc selenide substrate, developing substrates bonded to remove the photoresist adhered to a metal film and a support substrate thereof to obtain an optical antenna, and cleaning the optical antenna.

The fluorescent film layer production process comprises following steps:

(1) ultrasonically cleaning a third quartz or zinc selenide substrate with acetone, alcohol, and deionized water consecutively, and drying;

(2) coating photoresist on an end face of the third quartz or zinc selenide substrate cleaned, and drying for 5 minutes to 20 minutes;

(3) covering a photolithography mask on one side of the third quartz or zinc selenide substrate coated with photoresist, to process the photoresist by photolithography for 5 minutes to 20 minutes;

(4) developing the one side of the third quartz or zinc selenide substrate, rinsing with deionized water, and drying for 2 minutes to 5 minutes;

(5) etching the photoresist film on the third quartz or zinc selenide substrate with a parallel ion beam to obtain cellular grids having a depth of more than 100 μm, and cleaning; and (6) filling, in the cellular grids on the third quartz or zinc selenide substrate and by wet coating, a fluorescent film layer that is 5 μm to 100 μm in depth, drying and cleaning.

The process of integrating the optical antenna, the fluorescent film layer and the photosensitive array comprises following steps:

(1) leading out metal wires from one side of the optical antenna and the fluorescent film layer;

(2) aligning each antenna cell (comprising one or more nanocones) in the optical antenna, with a corresponding photosensitive cell of the photosensitive array and a corresponding fluorescent film cell of the fluorescent film layer, in a direction perpendicular to the plane of the optical antenna; and keeping the distance between the tip of each nanocone and the top surface of the fluorescent film layer between 150 nm and 700 nm, and keeping the distance between the fluorescent film layer and the photosensitive array between 100 nm and 800 nm; (3) sealing the optical antenna, the fluorescent film layer and the photosensitive array with an UV adhesive, drying, and connecting the metal wires led out from the optical antenna and the fluorescent film layer to pins inside the chip carrier.

It will be obvious to those skilled in the art that changes and modifications may be made, and therefore, the aim in the appended claims is to cover all such changes and modifications.

What is claimed is:

1. A device, comprising:
an optical antenna; and
a photosensitive array in parallel to the optical antenna;
wherein:
the optical antenna is an array structure comprising a plurality of antenna cells spaced apart and electrically connected to each other;
the photosensitive array is an array structure comprising a plurality of photosensitive cells spaced apart from each other;
the plurality of antenna cells and the plurality of photosensitive cells are equal in number;
each of antenna cells of the optical antenna is aligned, with a corresponding photosensitive cell of the photosensitive array, in a direction perpendicular to the plane of the optical antenna;
the plurality of antenna cells of the optical antenna each comprises one or more nanocones each comprising a top surface; top surfaces of the plurality of antenna cells are electrically connected to each other;
each of the one or more nanocones is a tapered structure, and the top surface of each of the one or more nanocones is a curved structure; and
one end of the optical antenna and one end of the photosensitive array are respectively connected to an external control signal source through metal wires.

2. The device of claim 1, wherein when the device is used to detect a weak optical signal with power in picowatts, each antenna cell comprises one or more nanocones spaced apart from each other at a fixed distance.

3. The device of claim 2, wherein a lower limit of a number of each of the one or more nanocones is such that the plurality of photosensitive cells can produce an effective signal output, and an upper limit of the number of each of the one or more nanocones is such that, after the one or more nanocones in a single antenna cell are paced apart from each other at a fixed distance, an overall size of the single antenna cell is not larger than that of a single photosensitive cell.

4. The device of claim 1, wherein a cross-section of the top surface of each of the one or more nanocones, along a plane perpendicular to an axis of the nanocone, is circular, elliptical, triangular, or polygonal.

5. The device of claim 4, wherein when the cross-section of the top surface of each of the one or more nanocones is circular, a diameter thereof is between 30 nm and 600 nm.

6. The device of claim 1, wherein a distance between a tip of each of the one or more nanocones and a top surface of the photosensitive array is between 10 nm and 60 nm.

7. The device of claim 1, wherein the device is packaged inside a chip carrier; the chip carrier comprises a first side oriented to the optical antenna and provided with an optical window thereby indicating the optical antenna is disposed on the first side, and a second side adjacent to the optical window and provided with an electronic interface through which the device is connected to a light path structure.

8. The device of claim 1, wherein when the device is used to detect either visible light or infrared light, the photosensitive array is a photon detector; and when the device is used to detect both visible light and infrared light, the photosensitive array is a thermal detector.

9. A device, comprising:
an optical antenna;
a fluorescent film layer; and
a photosensitive array;
wherein:
the optical antenna, the fluorescent film layer, and the photosensitive array are parallel to each other;
the optical antenna is an array structure comprising a plurality of antenna cells spaced apart and electrically connected to each other;
the fluorescent film layer is an array structure comprising a plurality of fluorescent film cells spaced apart and electrically connected to each other;
the photosensitive array is an array structure comprising a plurality of photosensitive cells spaced apart from each other;
array sizes and shapes of the optical antenna, the fluorescent film layer, and the photosensitive array are identical;
the plurality of antenna cells of the optical antenna, the plurality of fluorescent film cells at corresponding positions of the fluorescent film layer, and the plurality of photosensitive cells at corresponding positions of the photosensitive array are aligned with each other, respectively, perpendicularly to a parallel direction of the optical antenna, the fluorescent film layer, and the photosensitive array;
the plurality of antenna cells of the optical antenna each comprises one or more nanocones each comprising a top surface; top surfaces of the plurality of antenna cells are electrically connected to each other;
each of the one or more nanocones is a tapered structure, and the top surface of each of the one or more nanocones is a curved structure; and the one or more nanocones each comprises a tip pointing to a corresponding fluorescent film cell; and
one end of the optical antenna and one end of the fluorescent film layer are respectively connected to an external control signal source through metal wires.

10. The device of claim 9, wherein when the device is used to detect a weak optical signal with power in picowatts, each antenna cell comprises one or more nanocones spaced apart from each other at a fixed distance.

11. The device of claim 10, wherein a lower limit of a number of each of the one or more nanocones is such that the plurality of photosensitive cells can produce an effective signal output, and an upper limit of the number of each of the one or more nanocones is such that, after the one or more nanocones in a single antenna cell are spaced apart from each other at a fixed distance, an overall size of the single antenna cell is not larger than that of a single photosensitive cell.

12. The device of claim 9, wherein a cross-section of the top surface of each of the one or more nanocones, along a plane perpendicular to an axis of the nanocone, is circular, elliptical, triangular, or polygonal.

13. The device of claim 12, wherein when the cross-section of the top surface of each of the one or more nanocones, along a plane perpendicular to an axis of the nanocone, is circular, a diameter thereof is between 30 nm and 600 nm.

14. The device of claim 9, wherein a distance between the tip of each of the one or more nanocones and a top surface of the fluorescent film layer is between 150 nm and 700 nm; a distance between a bottom surface of the fluorescent film layer and a top surface of the photosensitive array is between 100 nm and 800 nm; and a distance between two adjacent fluorescent film cells is between 50 nm and 500 nm.

15. The device of claim 9, wherein the device is packaged inside a chip carrier; the chip carrier comprises a first side oriented to the optical antenna and provided with an optical window thereby indicating the optical antenna is disposed on the first side, and a second side adjacent to the optical window and provided with an electronic interface through which the device is connected to a light path structure.

* * * * *